(12) United States Patent
Miyamoto

(10) Patent No.: US 7,319,606 B2
(45) Date of Patent: Jan. 15, 2008

(54) MEMORY

(75) Inventor: Hideaki Miyamoto, Ogaki (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 11/090,660

(22) Filed: Mar. 28, 2005

(65) Prior Publication Data

US 2005/0213419 A1 Sep. 29, 2005

(30) Foreign Application Priority Data

Mar. 29, 2004 (JP) ............................. 2004-095392

(51) Int. Cl.
*G11C 11/22* (2006.01)

(52) U.S. Cl. ................. 365/145; 365/154; 365/230.03; 365/230.06

(58) Field of Classification Search ................ 365/195, 365/185.08
See application file for complete search history.

(56) References Cited

U.S. PATENT DOCUMENTS

| | | | | |
|---|---|---|---|---|
| 4,627,035 A | * | 12/1986 | Yashiro | 365/230.04 |
| 4,964,078 A | * | 10/1990 | Jandu et al. | 365/185.11 |
| 4,989,185 A | * | 1/1991 | Matsuo et al. | 365/185.11 |
| 5,305,276 A | * | 4/1994 | Uenoyama | 365/230.01 |
| 5,371,711 A | * | 12/1994 | Nakayama | 365/230.03 |
| 5,838,610 A | * | 11/1998 | Hashimoto | 365/168 |
| 6,122,216 A | * | 9/2000 | Dykes | 365/230.03 |
| 6,438,024 B1 | * | 8/2002 | Gold et al. | 365/154 |
| 6,480,929 B1 | * | 11/2002 | Gauthier et al. | 711/105 |
| 6,594,169 B2 | * | 7/2003 | Sakui | 365/51 |
| 6,614,703 B2 | * | 9/2003 | Pitts et al. | 365/221 |
| 6,680,861 B2 | * | 1/2004 | Kasai | 365/145 |
| 6,891,742 B2 | | 5/2005 | Takano et al. | |
| 2002/0031005 A1 | * | 3/2002 | Natori et al. | 365/145 |
| 2002/0093864 A1 | * | 7/2002 | Ooishi | 365/222 |
| 2002/0159289 A1 | * | 10/2002 | Senda et al. | 365/185.08 |
| 2003/0235095 A1 | * | 12/2003 | Inoue | 365/201 |
| 2004/0047226 A1 | * | 3/2004 | Gans et al. | 365/230.03 |

FOREIGN PATENT DOCUMENTS

| | | |
|---|---|---|
| JP | 2001-167584 | 6/2001 |
| WO | 2002-026283 A | 1/2002 |
| WO | 03/009302 A1 | 1/2003 |

\* cited by examiner

*Primary Examiner*—Tan T. Nguyen
(74) *Attorney, Agent, or Firm*—Arent Fox LLP

(57) ABSTRACT

A memory capable of effectively reducing the chip size not only by sharing a read/write circuit but also by reducing a memory cell size is provided. This memory comprises a first memory cell array having a plurality of first memory cells, a second memory cell array having a plurality of second memory cells different in type from the first memory cells and a selection control circuit provided separately from the first memory cell array and the second memory cell array for controlling selection of either the first memory cell array or the second memory cell array.

19 Claims, 7 Drawing Sheets

MEMORY

BACKGROUND OF THE INVENTION

1. Field of the Invention

The present invention relates to a memory, and more particularly, it relates to a memory comprising a plurality of different types of memory cells.

2. Description of the Background Art

A memory comprising a plurality of different types of memory cells is known in general. For example, Japanese Patent laying-Open No. 2001-167584 discloses such a memory.

The conventional memory disclosed in Japanese Patent Laying-Open No. 2001-167584 comprises 1T1C ferroelectric memory cells and SRAM (static random access memory) cells, while the ferroelectric memory cells and the SRAM cells share bit lines and a sense amplifier (read/write circuit) for reducing the chip size of the memory.

If the potential of any bit line shared by the corresponding ferroelectric and SRAM cells changes in an operation of reading or writing data from or in the corresponding SRAM cell in the aforementioned memory disclosed in Japanese Patent Laying-Open No. 2001-167584, the potential change of the bit line is transmitted to the corresponding ferroelectric memory cell. When the potential change of the bit line is transmitted to the ferroelectric memory cell in this manner, the quantity of polarization of a ferroelectric capacitor constituting the ferroelectric memory cell may be reduced by disturbance or data held in the ferroelectric capacitor may be destroyed. Therefore, the conventional memory disclosed in Japanese Patent Laying-Open No. 2001-167584 must employ ferroelectric memory cells having transistors for suppressing transmission of potential change of corresponding bit lines to ferroelectric capacitors. In the conventional memory disclosed in Japanese Patent Laying-Open No. 2001-167584, therefore, it is disadvantageously difficult to employ small-sized ferroelectric memory cells such as crosspoint memory cells, having no transistors, formed by arranging ferroelectric films between bit lines and word lines. Consequently, it is disadvantageously difficult to attain an effect of reducing the chip size by reducing the memory cell size in addition to the effect of reducing the chip size by sharing the sense amplifier (read/write circuit) between the ferroelectric memory cells and the SRAM memory cells.

SUMMARY OF THE INVENTION

The present invention has been proposed in order to solve the aforementioned problem, and an object of the present invention is to provide a memory capable of effectively reducing the chip size not only by sharing a read/write circuit but also by reducing a memory cell size.

In order to attain the aforementioned object, a memory according to an aspect of the present invention comprises a first memory cell array having a plurality of first memory cells, a second memory cell array having a plurality of second memory cells different in type from the first memory cells and a selection control circuit provided separately from the first memory cell array and the second memory cell array for controlling selection of either the first memory cell array or the second memory cell array.

The memory according to this aspect, provided with the selection control circuit controlling selection of either the first memory cell array or the second memory cell array as hereinabove described, can perform the read and write operations by selecting only either the first memory cell array or the second memory cell array. Also when the first and second memory cell arrays share a read/write circuit (sense amplifier) and the first memory cells have no transistors, therefore, the memory can inhibit potential change of a bit line caused upon selection of the second memory cell array for the read and write operations from transmission to the first memory cells of the non-selected first memory cell array, thereby inhibiting the first memory cells having no transistors from disturbance or data destruction following the potential change of the bit line. Therefore, the first memory cell array provided with the small-sized first memory cells having no transistors can share the read/write circuit (sense amplifier) with the second memory cell array, whereby the chip size can be effectively reduced not only by sharing the read/write circuit between the first and second memory cell arrays but also by reducing the memory cell size.

In the memory according to the aforementioned aspect, the first memory cells of the first memory cell array preferably have no transistors while having storage means arranged on the intersections between bit lines and word lines. According to this structure, the chip size can be effectively reduced not only by sharing the read/write circuit between the first and second memory cell arrays but also by reducing the memory cell size when the first memory cell array is constituted of a crosspoint memory cell array consisting of the first memory cells having no transistors.

In the aforementioned structure having the first memory cells including the storage means, each storage means is preferably constituted of two ferroelectric capacitors holding data inverse to each other. According to this structure, the first memory cell array can be easily constituted of the crosspoint memory cell array consisting of the first memory cells having no transistors through the storage means each constituted of the two ferroelectric capacitors obtained by arranging ferroelectric films between corresponding bit and word lines.

In the aforementioned structure having the first memory cells including the storage means, each storage means is preferably constituted of only one ferroelectric capacitor holding data. According to this structure, the first memory cell array can be easily constituted of the crosspoint memory cell array consisting of the first memory cells having no transistors through the storage means each constituted of only one ferroelectric capacitor obtained by arranging a ferroelectric film between the corresponding bit and word lines. Further, the storage means can be simply constituted of only single ferroelectric capacitors, whereby the memory cell size can be further reduced.

In the aforementioned structure including the first memory cells of the first memory cell array having no transistors, the second memory cell array is preferably formed under the first memory cell array in a multilayered manner. According to this structure, no transistors may be formed on a substrate in the first memory cell array including the crosspoint first memory cells having no transistors, whereby the second memory cell array can be easily formed on the substrate located under the first memory cell array. Thus, the chip size of the memory can be further reduced.

In the aforementioned structure having the second memory array formed under the first memory cell array in a multilayered manner, the second memory cells of the second memory cell array preferably have transistors. Also when the second memory cells have transistors, no transistors may be formed on the substrate in the first memory cell array including the first memory cells having no transistors as hereinabove described, whereby the second memory cell array including the second memory cells having transistors can be easily formed on the substrate located under the first memory cell array.

In the memory according to the aforementioned aspect, each second memory cell of the second memory cell array may include an SRAM cell.

The memory according to the aforementioned aspect preferably further comprises a first bit line connected to the first memory cells of the first memory cell array and a second bit line connected to the second memory cells of the second memory cell array, and the selection control circuit preferably controls selection of at least the first bit line between the first bit line and the second bit line. According to this structure, potential change of the second bit line can be inhibited from transmission to the first bit line when data is read or written from or in any second memory cell if the selection control circuit inhibits selection of the first bit line. Thus, inconvenience such as destruction of data in the first memory cells can be easily suppressed also when the first memory cells have no transistors.

In the aforementioned structure including the first and second bit lines, the memory preferably further comprises a read/write circuit for performing at least either data reading or data writing on the first memory cell array and the second memory cell array, the read/write circuit preferably includes a third bit line, and the selection control circuit preferably performs control of connecting at least the first bit line between the first and second bit lines to the third bit line of the read/write circuit. According to this structure, the selection control circuit can easily select at least any first memory cell so that the read/write circuit performs at least either data reading or data writing.

In the aforementioned structure having the read/write circuit including the third bit line, the selection control circuit preferably includes at least a first transistor connected between the first bit line and the third bit line for performing control of connecting the first bit line to the third bit line. According to this structure, the selection control circuit can easily perform the control of connecting the first bit line to the third bit line of the read/write circuit through the first transistor.

In the aforementioned structure having the selection control circuit including the first transistor, the selection control circuit preferably further includes a second transistor connected between the second bit line and the third bit line for performing control of connecting the second bit line to the third bit line. According to this structure, the selection control circuit can easily perform the control of connecting the second bit line to the third bit line of the read/write circuit in addition to the control of connecting the first bit line to the third bit line of the read/write circuit.

In the aforementioned structure having the selection control circuit including the first and second transistors, one of the first transistor and the second transistor preferably enters an OFF state when the other one of the first transistor and the second transistor is in an ON state. According to this structure, the first transistor is turned off when the second bit line is connected to the third bit line of the read/write circuit through the ON-state second transistor, whereby the first bit line can be prevented from connection to the third bit line of the read/write circuit through the first transistor. Thus, potential change of the second bit line can be easily inhibited from transmission to the first bit line when the read/write circuit performs a read or write operation on any second memory cell.

In the aforementioned structure having the first and second transistors so formed that one of the first and second transistors enters an OFF state when the other one is in an ON state, the first transistor and the second transistor are preferably of the same conductive type, the selection control circuit preferably includes an inverter circuit connected to the gate of the first transistor, the gate of the second transistor preferably receives a control signal for controlling the ON/OFF state of the second transistor, and the gate of the first transistor preferably receives an inverted signal of the control signal through the inverter circuit. According to this structure, an inverted signal for turning off the first transistor is input in the gate of the first transistor when a control signal for turning on the second transistor is input in the gate of the second transistor. When a control signal for turning off the second transistor is input in the gate of the second transistor, on the other hand, an inverted signal for turning on the first transistor is input in the gate of the first transistor. Thus, one of the first and second transistors can be easily turned off when the other one is in an ON state.

In the aforementioned structure including the first bit line, the first memory cell array preferably includes a plurality of first memory cell array portions, the first bit line preferably includes a first auxiliary bit line provided every first memory cell array portion and a first main bit line connected with a selected first auxiliary bit line, and the selection control circuit preferably also has a function of connecting the first auxiliary bit line of a selected first memory cell array portion to the first main bit line. According to this structure, no circuit may be separately provided for selectively connecting the first main bit line and the first auxiliary bit line with each other also when the first bit line connected to the first memory cells has a hierarchical bit line structure consisting of the first main bit line and the first auxiliary bit line, whereby the circuit structure can be simplified in the memory provided with the first bit line having the hierarchical bit line structure.

In the aforementioned structure including the first main bit line, the memory preferably further comprises a read/write circuit for either reading or writing data from or in the first memory cell array and the second memory cell array, the read/write circuit preferably includes a fourth bit line, and the first main bit line is preferably connected to the fourth bit line. According to this structure, the selection control circuit can easily select a first memory cell linked to the first auxiliary bit line of a selected first memory cell array portion so that the read/write circuit can perform at least either data reading or data writing in the memory including the first bit line having the hierarchical bit line structure.

In the aforementioned structure including the first main bit line and the first auxiliary bit line, the selection control circuit preferably includes a third transistor connected between the first auxiliary bit line and the first main bit line for performing control of connecting the first auxiliary bit line of the selected first memory cell array portion to the first main bit line. According to this structure, the third transistor of the selection control circuit can easily perform the control of connecting the first auxiliary bit line of the selected first memory cell array portion to the first main bit line.

In the aforementioned structure having the selection control circuit including the third transistor, each second memory cell of the second memory cell array preferably includes a fourth transistor performing control of connecting the second memory cell to the second bit line. According to this structure, the fourth transistor of each second memory cell can easily perform the control of connecting the second memory cell to the second bit line while the selection control circuit can perform the control of connecting the first auxiliary bit line of the selected first memory cell array portion to the first main bit line.

In the aforementioned structure having the second memory cells each including the fourth transistor, each second memory cell is preferably an SRAM cell, and the fourth transistor is preferably a selection control transistor included in the SRAM cell. According to this structure, the selection control transistor of the SRAM cell can be employed as the fourth transistor performing the control of connecting the second memory cell to the second bit line, whereby the structure of the second memory cell can be inhibited from complication also when the same includes the fourth transistor.

In the aforementioned structure including the third and fourth transistors, one of the third transistor and the fourth transistor preferably enters an OFF state when the other one of the third transistor and the fourth transistor is in an ON state. According to this structure, the third transistor is turned off when any second memory cell is connected to the second bit line (first main bit line) through the ON-state fourth transistor if the second bit line and the first main bit line are shared, whereby the first auxiliary bit line can be prevented from connection to the first main bit line through the third transistor. Thus, potential change of the fourth bit line can be inhibited from transmission to the first memory cells of the first memory cell array portion linked to the first auxiliary bit line when the read/write circuit performs a read or write operation on any second memory cell through the fourth bit line, the second bit line (first main bit line) and the fourth transistor.

In the aforementioned structure including the first main bit line and the second bit line, the first main bit line and the second bit line are preferably shared. According to this structure, the first main bit line of the first bit line and the second bit line may not be separately provided also when the first bit line connected to the first memory cells has a hierarchical bit line structure, whereby the number of wires can be reduced in the memory provided with the first bit line having the hierarchical bit line structure.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

The structure of a memory according to a first embodiment of the present invention is described with reference to FIGS. 1 to 3.

Figure 1:
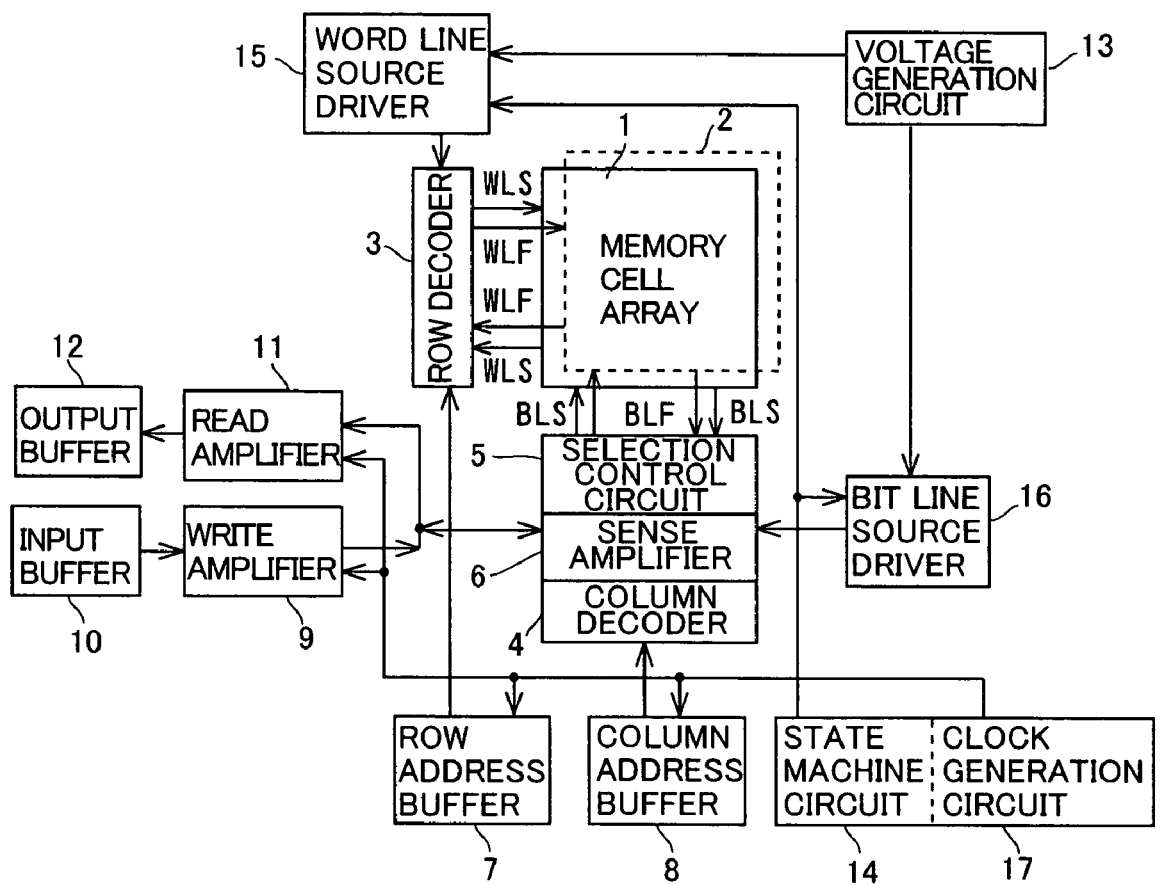
FIG. 1 is a block diagram showing the overall structure of a memory including a crosspoint ferroelectric memory cell array and an SRAM cell array according to a first embodiment of the present invention.

As shown in FIG. 1, the memory according to the first embodiment comprises an SRAM cell array 1, a crosspoint ferroelectric memory cell array 2, a row decoder 3, a column decoder 4, a selection control circuit 5, a sense amplifier 6, a row address buffer 7, a column address buffer 8, a write amplifier 9, an input buffer 10, a read amplifier 11, an output buffer 12, a voltage generation circuit 13, a state machine circuit 14, a word line source driver 15, a bit line source driver 16 and a clock generation circuit 17. The SRAM cell array 1 is an example of the "second memory cell array" in the present invention, and the crosspoint ferroelectric memory cell array 2 is an example of the "first memory cell array" in the present invention. The sense amplifier 6 is an example of the "read/write circuit" in the present invention.

The SRAM cell array 1 and the crosspoint ferroelectric memory cell array 2 are connected to the row decoder 3 through SRAM selection word lines WLS and ferroelectric memory selection word lines WLF respectively. The SRAM cell array 1 and the crosspoint ferroelectric memory cell array 2 are further connected to the selection control circuit 5 through SRAM selection bit lines BLS and ferroelectric memory selection bit lines BLF respectively. The selection control circuit 5 is connected to the column decoder 4 through the sense amplifier 6.

The word line source driver 15 is connected to the row decoder 3, while the voltage generation circuit 13 is connected to the word line source driver 15. The state machine circuit 14 is also connected to the word line source driver 15. The bit line source driver 16 is connected to the sense amplifier 6, and the voltage generation circuit 13 is connected to the bit line source driver 16. The write amplifier 9 and the read amplifier 11 are connected to the sense amplifier 6. The read amplifier 11 is also connected to the output buffer 12, while the write amplifier 9 is also connected to the input buffer 10. The clock generation circuit 17 is connected to the row address buffer 7, the column address buffer 8, the write amplifier 9 and the read amplifier 11.

Figure 2:
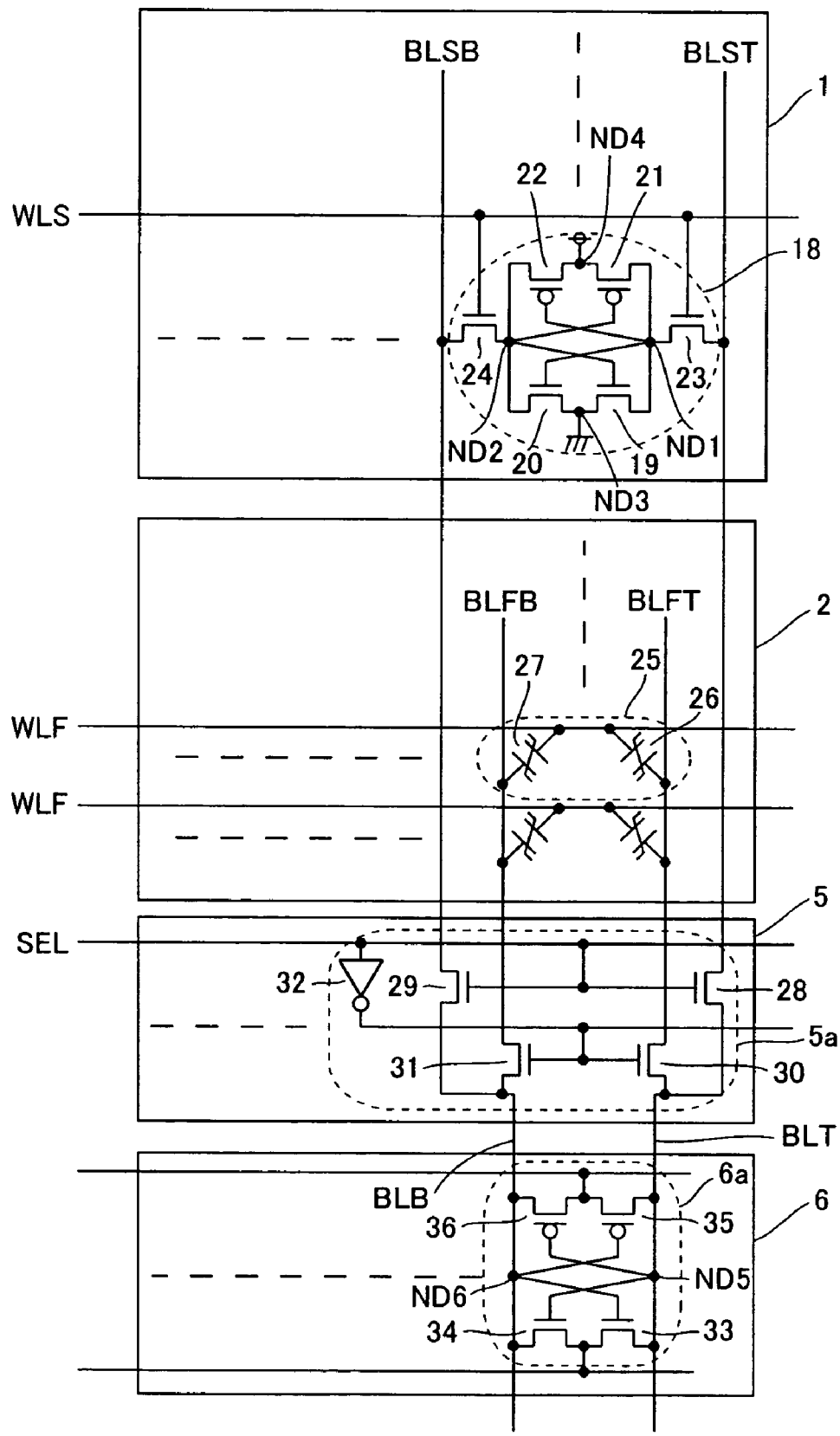
FIG. 2 is an equivalent circuit diagram for illustrating the structures of the SRAM cell array, the ferroelectric memory cell array, a selection control circuit and a sense amplifier in the memory according to the first embodiment shown in FIG. 1.

Referring to FIG. 2, the SRAM cell array 1 is constituted of a plurality of SRAM cells 18. However, FIG. 2 shows only one SRAM cell 18, in order to simplify the illustration. The SRAM cells 18 are examples of the "second memory cells" in the present invention. Each SRAM cell 18 is constituted of six transistors, i.e., driving transistors consisting of n-channel transistors (n-type MOS transistors) 19 and 20, load transistors consisting of p-channel transistors (p-type MOS transistors) 21 and 22 and selection transistors 23 and 24 consisting of n-channel transistors (n-type MOS transistors). Inputs/outputs of a CMOS inverter consisting of the n-channel transistor 19 and the p-channel transistor 21 and another CMOS inverter consisting of the n-channel transistor 20 and the p-channel transistor 22 are cross-coupled with each other. One of source/drain regions of the selection transistor 23 is connected to a first data holding node ND1, while one of source/drain regions of the selection transistor 24 is connected to a second data holding node ND2. The other source/drain regions of the selection transistors 23 and 24 are connected to SRAM selection bit lines BLST and BLSB respectively. A pair of bit lines consisting of the SRAM selection bit lines BLST and BLSB are examples of the "second bit line" in the present invention. The aforementioned SRAM selection bit lines BLS (see FIG. 1) are constituted of such pairs of SRAM selection bit lines BLST and BLSB. Both of the gates of the selection transistors 23 and 24 are connected to an SRAM selection word line WLS. A node ND3 between first ones of source/drain regions of the n-channel transistors 19 and 20 is grounded while a positive voltage VCC is supplied to a node ND4 between first ones of source/drain regions of the p-channel transistors 21 and 22.

The crosspoint ferroelectric memory cell array 2 is constituted of a plurality of ferroelectric memory cells 25 having no transistors. FIG. 2 shows only two ferroelectric memory cells 25, in order to simplify the illustration. The ferroelectric memory cells 25 are examples of the "first memory cells" in the present invention. According to the first embodiment, each ferroelectric memory cell 25 is constituted of a ferroelectric capacitor 26 arranged on the intersection between a corresponding ferroelectric memory selection bit line BLFT and a corresponding ferroelectric memory selection word line WLF and another ferroelectric capacitor 27 arranged on the intersection between another corresponding ferroelectric memory selection bit line BLFB and the ferroelectric memory selection word line WLF. The ferroelectric capacitor 26 holds data "0" or "1" to be held in the ferroelectric memory 25, while the ferroelectric capacitor 27 holds data "1" or "0" inverse to that held in the ferroelectric capacitor 26. The ferroelectric capacitors 26 and 27 are examples of the "storage means" in the present invention. First and second electrodes of the ferroelectric capacitor 26 are connected to the ferroelectric memory selection bit line BLFT and the ferroelectric memory selection word line WLF respectively. First and second electrodes of the other ferroelectric capacitor 27 are connected to the ferroelectric memory selection bit line BLFB and the ferroelectric memory selection word line WLF respectively. A pair of bit lines consisting of the ferroelectric memory selection bit lines BLFT and BLFB are examples of the "first bit line" in the present invention. The aforementioned ferroelectric memory selection bit lines BLF (see FIG. 1) are constituted of such pairs of ferroelectric memory selection bit lines BLFT and BLFB.

The selection control circuit 5 is constituted of a plurality of control circuit parts 5a, each of which is provided every pair of bit lines BLFT and BLFB (BLST and BLSB). FIG. 2 shows only one selection control circuit part 5a, in order to simplify the illustration. According to the first embodiment, each selection control circuit part 5a has a function of selecting either the pair of SRAM selection bit lines BLST and BLSB or the pair of ferroelectric memory selection bit lines BLFT and BLFB and connecting the same to bit lines BLT and BLB of the sense amplifier 6 described later. Each selection control circuit part 5a is constituted of SRAM selection transistors 28 and 29, ferroelectric memory selection transistors 30 and 31 and an inverter circuit 32. The SRAM selection transistors 28 and 29 are examples of the "second transistor" in the present invention, and the ferro-electric memory selection transistors 30 and 31 are examples of the "first transistor" in the present invention. All of the SRAM selection transistors 28 and 29 and the ferroelectric memory selection transistors 30 and 31 are constituted of n-type MOS transistors. Source/drain regions of the SRAM selection transistor 28 are connected to the SRAM selection bit line BLST and a bit line BLT of a sense amplifier circuit part 6a described later respectively. Source/drain regions of the SRAM selection transistor 29 are connected to the SRAM selection bit line BLSB and another bit line BLB of the sense amplifier circuit 6a described later respectively. An SRAM activation signal SEL is input in the gates of the SRAM selection transistors 28 and 29 respectively.

Source/drain regions of the ferroelectric memory selection transistor 30 are connected to the ferroelectric memory selection bit line BLFT and the bit line BLT of the sense amplifier circuit part 6a described later respectively. Source/drain regions of the ferroelectric memory selection transistor 31 are connected to the ferroelectric memory selection bit line BLFB and the bit line BLB of the sense amplifier circuit 6a described later respectively. An inverted signal of the SRAM activation signal SEL inverted in polarity by the inverter circuit 32 is input in the gates of the ferroelectric memory selection transistors 30 and 31 respectively.

The sense amplifier 6 is constituted of a plurality of sense amplifier circuit parts 6a, each of which is provided every pair of bit lines BLFT and BLFB (BLST and BLSB). FIG. 2 shows only one sense amplifier circuit part 6a, in order to simplify the illustration. The sense amplifier circuit parts 6a have a function of performing data reading and data writing on the SRAM cell array 1 and the ferroelectric memory cell array 2. Each sense amplifier circuit part 6a is constituted of n-channel transistors (n-type MOS transistors) 33 and 34 and p-channel transistors (p-type MOS transistors) 35 and 36. Inputs/outputs of a CMOS inverter consisting of the n-channel transistor 33 and the p-channel transistor 35 and another CMOS inverter consisting of the n-channel transistor 34 and the p-channel transistor 36 are cross-coupled with each other. The bit lines BLT and BLB are connected to nodes ND5 and ND6 respectively. The bit lines BLT and BLB are examples of the "third bit line" in the present invention. The sense amplifier 6 is provided therein with a precharging/equalization circuit (not shown) for setting the potentials of the bit lines BLT and BLB to VSS and a bit line driver (not shown) for driving the bit lines BLFT and BLFB in order to rewrite data in any ferroelectric memory cell 26.

Figure 3:
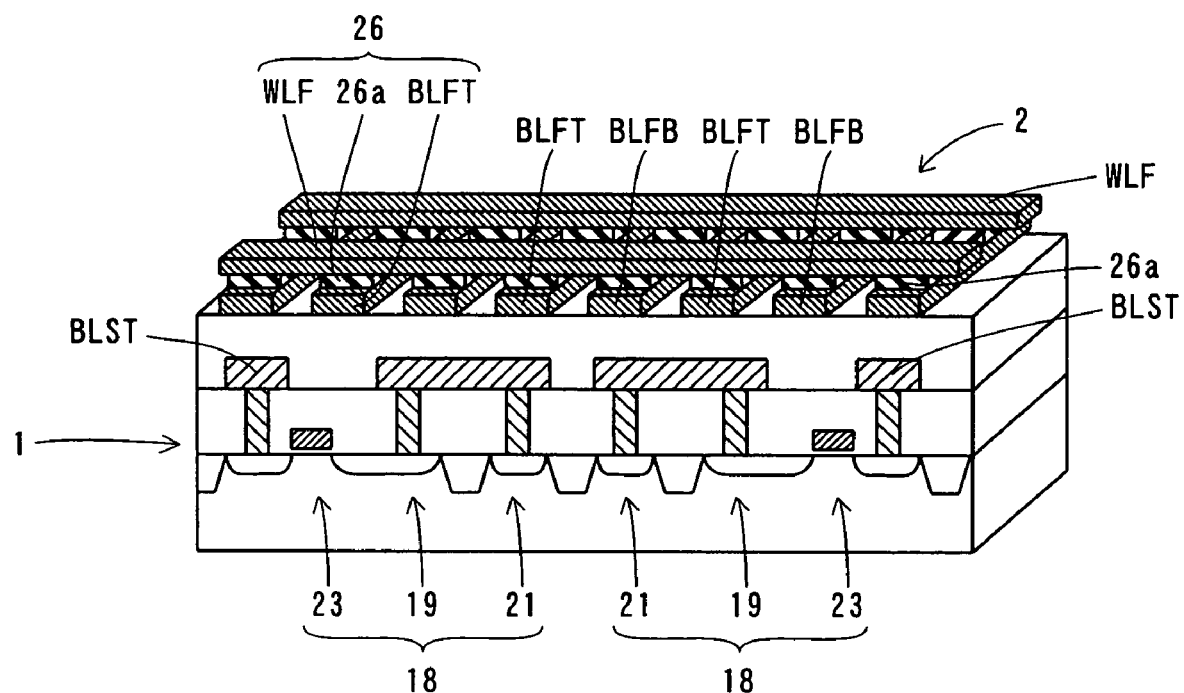
FIG. 3 is a sectional view showing a multilayer structure of the SRAM cell array and the ferroelectric memory cell array.

According to the first embodiment, the SRAM cell array 1 including the plurality of SRAM cells 18 having transistors is formed under the crosspoint ferroelectric memory cell array 2 including the plurality of ferroelectric memory cells 25 having no transistors in a multilayered manner, as shown in FIG. 3. In the ferroelectric memory cell array 2, the plurality of ferroelectric memory selection word lines WLF and the plurality of ferroelectric memory selection bit lines BLFT and BLFB are arranged to intersect with each other. Ferroelectric films 26a are arranged on the intersections between the ferroelectric memory selection word lines WLF and the ferroelectric memory selection bit lines BLFT and BLFB respectively. The ferroelectric memory selection word lines WLF, the ferroelectric films 26a and the ferroelectric memory selection bit lines BLFT (BLFB) constitute the ferroelectric capacitors 26.

Data read and write operations on the SRAM cell array 1 and the ferroelectric memory cell array 2 of the memory according to the first embodiment are now described with reference to FIGS. 1 and 2. Read and write operations on the SRAM cell array 1 are first described.

(Common to Read and Write Operations on SRAM Cell Array)

In the read and write operations on the SRAM cell array 1, a high-level SRAM activation signal SEL (see FIG. 2) is input in the gates of the SRAM selection transistors 28 and 29, thereby turning on the SRAM selection transistors 28 and 29.

At this time, an inverted signal of the SRAM activation signal SEL inverted in polarity by the inverter circuit 32 is input in the gates of the ferroelectric memory selection transistors 30 and 31. Thus, the ferroelectric memory selection transistors 30 and 31 are turned off due to the low-level inverted signal received in the gates thereof. In this case, no potential change of the bit lines BLT and BLB of the sense amplifier circuit part 6a is transmitted to the ferroelectric memory selection bit lines BLFT and BLFB following the read and write operations on the SRAM cell array 1, whereby the ferroelectric capacitors 26 and 27 are prevented from disturbance or destruction of data held therein. The precharging/equalization circuit (not shown) provided in the sense amplifier 6 supplies a signal of a potential VSS (low level), thereby setting the potentials of the bit lines BLT and BLB to VSS (low level). Thus, the memory enters a standby state for the data read and write operations on the SRAM cell array 1. A case of reading data from the SRAM cell array 1 from this standby state is now described.

(Read Operation on SRAM Cell Array)

First, a row address is externally input in the row decoder 3 through the row address buffer 7 (see FIG. 1), thereby selecting the word line WLS corresponding to the input row address and setting the same high. Thus, the selection transistors 23 and 24 of the SRAM cell 18 (see FIG. 2) linked with the selected word line WLS are turned on. Then, potentials corresponding to the data held in the SRAM cell 18 are transmitted to the SRAM selection bit lines BLST and BLSB through the ON-state selection transistors 23 and 24. When the potentials of the nodes ND1 and ND2 are held at high and low levels respectively so that the SRAM cell 18 holds data "1", for example, the potential of the SRAM selection bit line BLST receiving the potential of the node ND1 is gradually raised from the low level (VSS) to a high level, while the potential of the SRAM selection bit line BLSB receiving the potential of the node ND2 is held at VSS (low level). When the potentials of the nodes ND1 and ND2 are low and high levels respectively to the contrary, the potential of the SRAM selection bit line BLST receiving the potential of the node ND1 is held at the low level (VSS) while the potential of the SRAM selection bit line BLSB receiving the potential of the node ND2 is gradually raised from VSS (low level) to a high level.

The potentials of the SRAM selection bit lines BLST and BLSB are transmitted to the bit lines BLT and BLB of the sense amplifier circuit parts 6a through the ON-state SRAM selection transistors 28 and 29 respectively. Thereafter the sense amplifier 6 is activated at prescribed timing. Thus, the sense amplifier circuit parts 6a of the sense amplifier 6 compare and amplify the potentials of the bit lines BLT and BLB. A column address is externally input in the column decoder 4 through the column address buffer 8, thereby selecting the sense amplifier circuit part 6a corresponding to the input column address. The potentials of the bit lines BLT and BLB amplified by the selected sense amplifier circuit part 6a are transmitted to the read amplifier 11 (see FIG. 1), and read out from the read amplifier 11 through the output buffer 12. Thus, the potentials corresponding to the data "1" or "0" held in the corresponding SRAM cell 18 are read out.

The read operation on the SRAM cell array 1 is performed in the aforementioned manner.

A case of performing the data write operation on the SRAM cell array 1 from the aforementioned standby state is now described.

(Write Operation on SRAM Cell Array)

The data write operation on the SRAM array 1 is performed similarly to the aforementioned read operation from rise of the target word line WLS up to amplification of the potentials of the corresponding bit lines BLT and BLB with the corresponding sense amplifier circuit parts 6a. Thereafter a data signal corresponding to data to be written in the target SRAM cell 18 is externally input in the input buffer 10 (see FIG. 1). The input buffer 10 latches the received data signal for driving the write amplifier 9 with this data signal. Then, a column address is externally input in the column decoder 4 through the column address buffer 8. Thus, the column decoder 4 selects the sense amplifier circuit part 6a (see FIG. 2) corresponding to the received column address. The write amplifier 9 inputs the data signal latched by the input buffer 10 in the bit lines BLT and BLB of the selected sense amplifier circuit part 6a. Thus, the potentials of the bit lines BLT and BLB reach levels corresponding to the data to be written in the SRAM cell 18. For example, the potentials of the bit lines BLT and BLB go high and low respectively, in order to write data "1" in the SRAM cell 18. In order to write data "0" in the SRAM cell 18, on the other hand, the potentials of the bit lines BLT and BLB go low and high respectively.

The potentials of the bit lines BLT and BLB corresponding to the data "1" or "0" are transmitted to the SRAM cell 18 through the SRAM selection transistor 28 and the SRAM selection bit line BLST and through the SRAM selection transistor 29 and the SRAM selection bit line BLSB respectively. At this time, the ferroelectric memory selection transistors 30 and 31 are in OFF states and hence the potentials of the bit lines BLT and BLB corresponding to the data "1" or "0" are not transmitted to the ferroelectric capacitors 26 and 27 of the ferroelectric memory cells 25. The selection transistors 23 and 24 of the SRAM cell 18 are in ON states, whereby the potentials of the data holding nodes ND1 and ND2 of the SRAM cell 18 reach the levels corresponding to the data "1" or "0" respectively. In other words, the potentials of the nodes ND1 and ND2 go high and low respectively in order to write the data "1". In order to write the data "0", on the other hand, the potentials of the nodes ND1 and ND2 go low and high respectively. Thus, the data is written in the SRAM cell 18. The data write operation on the SRAM cell array 1 is performed in the aforementioned manner.

Read and write operations on the ferroelectric memory cell array 2 are now described.

(Common to Read and Write Operations on Ferroelectric Memory Cell Array)

In the read and write operations on the ferroelectric memory cell array 2, a low-level SRAM activation signal SEL (see FIG. 2) is input in the gates of the SRAM selection transistors 28 and 29 in a standby state. Thus, the SRAM selection transistors 28 and 29 are turned off. An inverted signal of the SRAM activation signal SEL inverted in polarity by the inverter circuit 32 is input in the gates of the ferroelectric memory selection transistors 30 and 31. Thus, the ferroelectric memory selection transistors 30 and 31 are turned on due to the high-level inverted signal received in the gates thereof. The precharging/equalization circuit (not shown) provided in the sense amplifier 6 supplies a signal of the potential VSS (low level), thereby setting the potentials of the corresponding bit lines BLT and BLB to VSS (low level). Thus, the memory enters a standby state for performing the data read and write operations on the ferroelectric memory cell array 2. A case of performing the data read operation on the ferroelectric memory cell array 2 from this standby state is now described.

(Read Operation on Ferroelectric Memory Cell Array)

In the read operation on the ferroelectric memory cell array 2, data are read from all ferroelectric memory cells 25 linked with a selected ferroelectric memory selection word line WLF. First, a row address is externally input in the row decoder 3 through the row address buffer 7 (see FIG. 1), thereby selecting the ferroelectric memory selection word line WLF corresponding to the input row address and setting the same high. Thus, potentials corresponding to the data held in the ferroelectric capacitors 26 and 27 of the ferroelectric memory cells 25 (see FIG. 2) linked with the selected ferroelectric memory selection word line WLF appear on the ferroelectric memory selection bit lines BLFT and BLFB respectively. It is assumed that the ferroelectric capacitors 26 and 27 hold data "1" and "0" corresponding to high and low levels respectively so that the ferroelectric memory cells 25 hold the data "1", for example. In this case, a potential higher than that of the ferroelectric memory selection bit line BLFB connected with each ferroelectric capacitor 27 appears on the ferroelectric memory selection bit line BLFT connected with each ferroelectric capacitor 26 due to the high level of the selected ferroelectric memory selection word line WLF. On the other hand, it is assumed that the ferroelectric capacitors 26 and 27 hold the data "0" and "1" corresponding to low and high levels respectively so that the ferroelectric memory cells 25 hold the data "0". In this case, a potential lower than that of the ferroelectric memory selection bit line BLFB connected with each ferroelectric capacitor 27 appears on the ferroelectric memory selection bit line BLFT connected with each ferroelectric capacitor 26 due to the high level of the selected ferroelectric memory selection word line WLF.

The potentials appearing on the ferroelectric memory selection bit lines BLFT and BLFB are transmitted to the bit lines BLT and BLB through the ferroelectric memory selection transistors 30 and 31 respectively. Thereafter the sense amplifier 6 is activated at proper timing. Thus, the sense amplifier circuit parts 6a compare and amplify the potentials of the bit lines BLT and BLB. A column address is externally input in the column decoder 4 through the column address buffer 8 (see FIG. 1), for selecting the sense amplifier circuit part 6a corresponding to the input column address. The potentials of the bit lines BLT and BLB amplified by the selected sense amplifier circuit part 6a are transmitted to the read amplifier 11 and externally read out through the output buffer 12. Thus, the potentials corresponding to the data "1" or "0" held in the corresponding ferroelectric memory cell 25 are read out. The read operation on the ferroelectric memory cell array 2 is performed in the aforementioned manner.

The data held in the ferroelectric capacitors 26 and 27 are destroyed in all ferroelectric memory cells 25 linked with the selected ferroelectric memory selection word line WLF subjected to the read operation, and hence a data rewrite operation is performed on the ferroelectric capacitors 26 and 27 subjected to the data destruction. The bit line driver (not shown) provided in the sense amplifier 6 drives all bit lines BLT and BLB while the word line driver (not shown) provided in the row decoder 3 drives the ferroelectric memory selection word line WLF linked with the ferroelectric capacitors 26 and 27 to be subjected to the data rewrite operation. At this time, the bit line driver (not shown) applies voltages corresponding to the potentials appearing on the bit lines BLT and BLB in the aforementioned read operation to the bit lines BLT and BLB. The word line driver (not shown) also applies a prescribed voltage to the ferroelectric memory selection word line WLF linked with the ferroelectric capacitors 26 and 27 to be subjected to the data rewrite operation. The prescribed voltage applied to the ferroelectric memory selection word line WLF is so set that the potential difference between the same and the potentials of the aforementioned bit lines BLT and BLB reaches potential difference corresponding to the data read from the ferroelectric capacitors 26 and 27 of each ferroelectric memory cell 25 in the aforementioned read operation. The voltages applied to the bit lines BLT and BLB are transmitted to the ferroelectric memory selection bit lines BLFT and BLFB, so that voltages are applied to the ferroelectric capacitors 26 and 27 for writing data therein. The data rewrite operation is performed in the aforementioned manner.

A case of performing the data write operation on the ferroelectric memory cell array 2 from the aforementioned standby state is now described.

(Write Operation on Ferroelectric Memory Cell Array)

The write operation on the ferroelectric memory cell array 2 is performed similarly to the aforementioned read operation on the ferroelectric memory cell array 2 from rise of the target ferroelectric memory selection word line WLF up to amplification of the potentials of the bit lines BLT and BLB by the sense amplifier circuit parts 6a. Thereafter a data signal corresponding to data to be written in the target ferroelectric memory cell 25 is externally input in the input buffer 10 (see FIG. 1). The input buffer 10 latches the received data signal and drives the write amplifier 9 with this data signal. Then, a column address is externally input in the column decoder 4 through the column address buffer 8. Thus, the column decoder 4 selects the sense amplifier circuit part 6a (see FIG. 2) corresponding to the received column address. The write amplifier 9 inputs the data signal latched by the input buffer 10 in the bit lines BLT and BLB of the selected sense amplifier circuit part 6a. Thus, the potentials of the bit lines BLT and BLB of the selected sense amplifier circuit part 6a reach levels corresponding to the data to be written in the ferroelectric memory cell 25.

In order to write data "1" in the ferroelectric memory cell 25, for example, the potential of the bit line BLT is set higher than the high-level potential of the ferroelectric memory selection word line WLF by at least the coercive voltage of the ferroelectric capacitor 26 while the potential of the bit line BLB is set lower than the high-level potential of the ferroelectric memory selection word line WLF by at least the coercive voltage of the ferroelectric capacitor 26. In order to write data "0" in the ferroelectric memory cell 25, on the other hand, the potential of the bit line BLT is set lower than the high-level potential of the ferroelectric memory selection word line WLF by at least the coercive voltage of the ferroelectric capacitor 26 while the potential of the bit line BLB is set higher than the high-level potential of the ferroelectric memory selection word line WLF by at least the coercive voltage of the ferroelectric capacitor 26. The term "coercive voltage" denotes a voltage necessary for polarization-inverting the ferroelectric capacitor 26. The potentials of the bit lines BLT and BLB are transmitted to the ferroelectric memory selection bit lines BLFT and BLFB through the ON-state ferroelectric memory selection control transistors 30 and 31, so that the data is written in the ferroelectric capacitors 26 and 27 of the ferroelectric memory cell 25. The write operation on the ferroelectric memory cell array 2 is performed in the aforementioned manner.

In the write operation, data are destroyed in the ferroelectric memory cells 25 linked with the selected ferroelectric memory selection word line WLH but not subjected to the data write operation, and hence a data rewrite operation is performed after the write operation. This data rewrite operation following the write operation is performed similarly to the aforementioned rewrite operation following the read operation except that only the ferroelectric memory cells 25 linked with the selected ferroelectric memory selection word line WLH but not subjected to the data write operation are selected for this operation.

According to the first embodiment, as hereinabove described, the selection control circuit 5 controlling selection of the ferroelectric memory cell array 2 and the SRAM cell array 1 is so provided that only either the ferroelectric memory cell array 2 or the SRAM cell array 1 can be selected for the read and write operations. Thus, potential change of the bit lines BLT and BLB can be inhibited from transmission to the ferroelectric memory cells 25 of the non-selected ferroelectric memory cell array 25 in the read and write operations performed on the SRAM cell array 1 also when the ferroelectric memory cell array 2 and the SRAM cell array 1 share the sense amplifier 6 and the ferroelectric memory cells 25 have no transistors, whereby the ferroelectric capacitors 26 and 27 of the ferroelectric memory cells 25 having no transistors can be inhibited from disturbance or data destruction following the potential change of the bit lines BLT and BLB. Also when the small-sized crosspoint ferroelectric memory cells 25 including no transistors are employed, therefore, the ferroelectric memory cells 25 and the SRAM cells 18 can share the sense amplifier 6, for attaining the effect of reducing the chip size not only by sharing the sense amplifier 6 but also by reducing the memory cell size.

According to the first embodiment, further, the SRAM cell array 1 is formed under the ferroelectric memory cell array 2 in a multilayered manner so that no transistors may be formed on a substrate in the ferroelectric memory cell array 2 including the crosspoint ferroelectric memory cells 25, whereby the SRAM cell array 1 can be easily formed on the substrate located under the ferroelectric memory cell array 2. Thus, the chip size of the memory can be further reduced.

Second Embodiment

Figure 4:
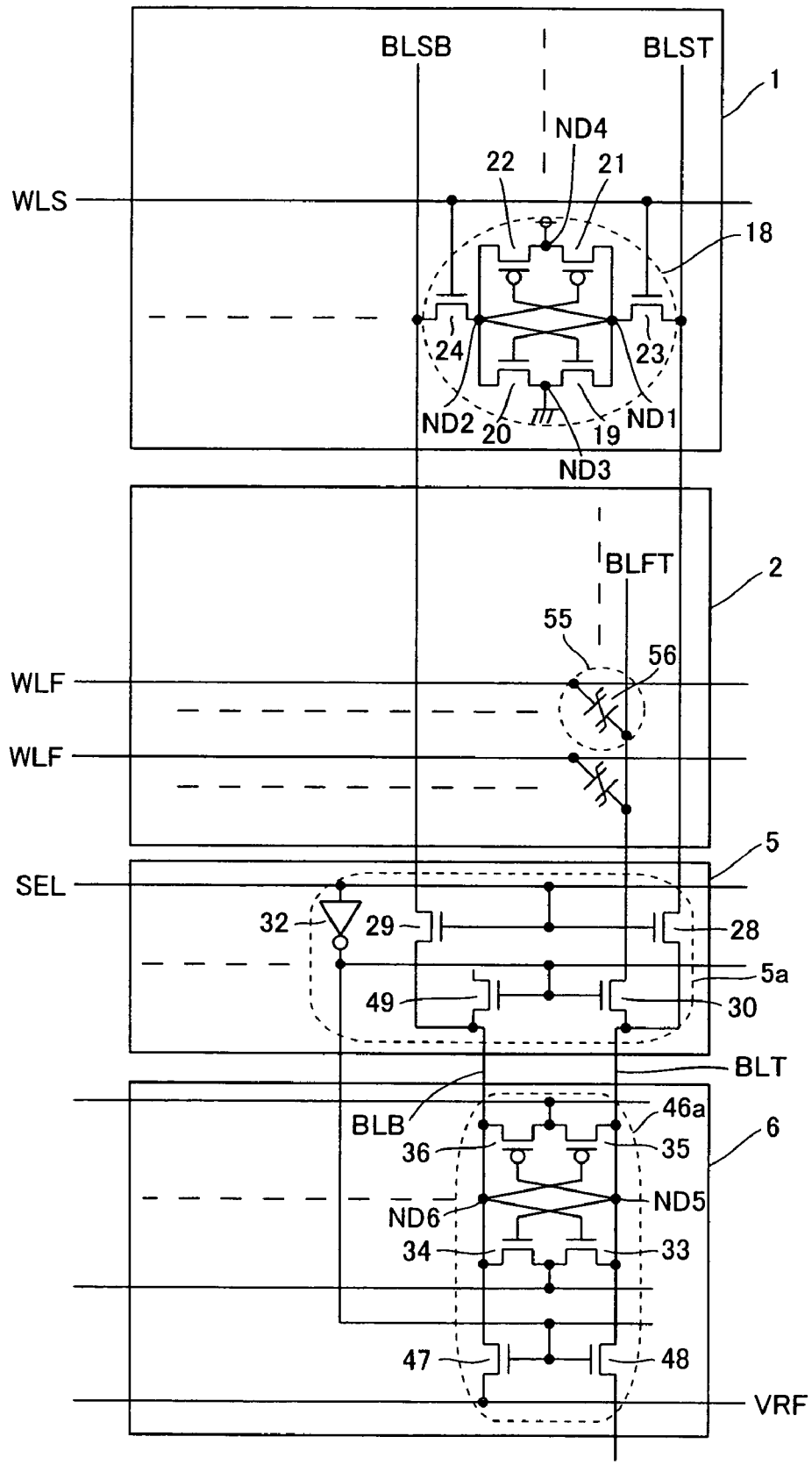
FIG. 4 is an equivalent circuit diagram for illustrating the structure of a memory according to a second embodiment of the present invention.

The structure of a memory according to a second embodiment of the present invention is now described with reference to FIG. 4.

According to the second embodiment, each ferroelectric memory cell 55 of a crosspoint ferroelectric memory cell array 2 is constituted of one ferroelectric capacitor 56, dissimilarly to the aforementioned first embodiment. First and second electrodes of the ferroelectric capacitor 56 are connected to a ferroelectric memory selection word line WLF and a ferroelectric memory selection bit line BLFT respectively. The memory according to the second embodiment is provided with no ferroelectric memory selection bit lines BLFB, dissimilarly to the memory according to the aforementioned first embodiment. Each sense amplifier circuit part 46a has n-channel transistors 33 and 34, p-channel transistors 35 and 36 and two additional n-channel transistors 47 and 48. One of source/drain regions of the n-channel transistor 47 is connected to a node ND6 and a bit line BLB, while the other one is supplied with a reference potential VRF. One of source/drain regions of the n-channel transistor 48 is connected to a node ND5 and a bit line BLT, while the other one is connected to a write amplifier 9 (see FIG. 1) and a read amplifier 11. The n-channel transistor 48 is provided for balancing the capacities of the bit line BLB connected with the n-channel transistor 47 and the bit line BLT.

An inverted signal of an SRAM activation signal SEL inverted in polarity by an inverter circuit 32 is input in both of the gates of the n-channel transistors 47 and 48. Each selection control circuit part 5a is provided with an n-channel transistor 49 in place of the ferroelectric memory selection transistor 31 (see FIG. 2) in the aforementioned first embodiment. One of source/drain regions of the n-channel transistor 49 is connected to the bit line BLB, while the other one is non-connected. The gate of the n-channel transistor 49 receives the inverted signal of the SRAM activation signal SEL inverted in polarity by the inverter circuit 32. This n-channel transistor 49 is provided for balancing the capacities of the bit line BLT connected with a ferroelectric memory selection transistor 30 and the bit line BLB. The remaining structure of the memory according to the second embodiment is similar to that of the memory according to the aforementioned first embodiment.

Operations of the memory according to the second embodiment are now described with reference to FIGS. 1 and 4. Read and write operations of the memory according to the second embodiment on an SRAM cell array 1 are similar to those of the memory according to the aforementioned first embodiment on the SRAM cell array 1, and hence read and write operations of the memory according to the second embodiment on the ferroelectric memory cell array 2 are described.

(Common to Read and Write Operations on Ferroelectric Memory Cell Array)

In the read and write operations on the ferroelectric memory cell array 2 (see FIG. 4), the memory according to the second embodiment enters a standby state similarly to the memory according to the aforementioned first embodiment. In other words, the memory turns on the ferroelectric memory selection transistor 30 and the n-channel transistor 49, while setting the potentials of the bit lines BLT and BLB to VSS (low level). A case of performing the read operation on the ferroelectric memory cell array 2 from this standby state is now described.

(Read Operation on Ferroelectric Memory Cell Array)

In the read operation on the ferroelectric memory cell array 2, data are read from all ferroelectric memory cells 55 linked with a selected ferroelectric memory selection word line WLF. First, a row address is externally input in a row decoder 3 through a row address buffer 7 (see FIG. 1), for selecting the ferroelectric memory selection word line WLF corresponding to the input row address and setting the same high. Thus, a potential corresponding to the data held in the ferroelectric capacitors 56 of the ferroelectric memory cells 55 linked with the selected ferroelectric memory selection word line WLF appears on the ferroelectric memory selection bit line BLFT. For example, the potential of the ferroelectric memory selection bit line BLFT reaches VRF+Vα when the ferroelectric memory cells 55 hold data "1", while the former reaches VRF−Vα when the latter hold data "0". Vα denotes a voltage corresponding to the quantity of polarization having been held in the ferroelectric capacitors 56.

The potential appearing on the ferroelectric memory selection bit line BLFT is transmitted to the bit line BLT through the ferroelectric memory selection transistor 30.

Further, the reference potential VRF is supplied to the bit line BLB through the ON-state n-channel transistor 47. Thereafter a sense amplifier 6 is activated at prescribed timing. Thus, the sense amplifier circuit parts 46*a* of the sense amplifier 6 compare and amplify the potentials of the bit lines BLT and BLB. A column address is externally input in a column decoder 4 through a column address buffer 8, for selecting the sense amplifier circuit part 46*a* corresponding to the input column address. The potentials of the bit lines BLT and BLB amplified in the selected sense amplifier circuit part 46*a* are transmitted to a read amplifier 11 through the n-channel transistor 48. The transmitted potentials are read out from the read amplifier 11 through an output buffer 12. Thus, potentials corresponding to the data "1" or "0" held in the target ferroelectric memory cell 55 are read out. The read operation on the ferroelectric memory cell array 2 is performed the aforementioned manner.

The data held in the ferroelectric capacitors 56 are destroyed in all ferroelectric memory cells 55 linked to the selected ferroelectric memory selection word line WLF subjected to the read operation, and hence a data rewrite operation is performed on the ferroelectric capacitors 56 subjected to the data destruction. A bit line driver (not shown) provided in the sense amplifier 6 drives all bit lines BLT while a word line driver (not shown) provided in the row decoder 3 drives the ferroelectric memory selection word line WLF linked with the ferroelectric capacitors 56 to be subjected to the data rewrite operation. At this time, voltages corresponding to the data "1" or "0" read in the aforementioned read operation are applied to the bit line BLT and the ferroelectric memory selection word line WLF respectively. When the data "1" has been read in the read operation, for example, voltages are so applied to the bit line BLT and the word line WLF that the voltage applied to the bit line BLT is larger than that applied to the ferroelectric memory selection word line WLF by at least the coercive voltage of the ferroelectric capacitors 56. When the data "0" has been read in the read operation, on the other hand, voltages are so applied to the bit line BLT and the ferroelectric memory selection word line WLF that the voltage applied to the bit line BLT is smaller than that applied to the ferroelectric memory selection word line WLF by at least the coercive voltage of the ferroelectric capacitors 56. The potential of the bit line BLT is transmitted to the ferroelectric memory selection bit line BLFT, whereby the potential difference between the ferroelectric memory selection word line WLF and the ferroelectric memory selection bit line BLFT is applied to the ferroelectric capacitors 56. Thus, data are written in the ferroelectric capacitors 56. The data rewrite operation is performed on the ferroelectric memory cells 55 in the aforementioned manner.

A case of performing the data write operation on the ferroelectric memory cell array 2 from the aforementioned standby state is now described.

(Write Operation on Ferroelectric Memory Cell Array)

The write operation on the ferroelectric memory cell array 2 is performed similarly to the aforementioned read operation from rise of the target ferroelectric memory selection word line WLF up to amplification of the potentials of the bit lines BLT by the sense amplifier circuit parts 46*a*. Thereafter a data signal to be written in the target ferroelectric memory cell 55 is externally input in an input buffer 10 (see FIG. 1). The input buffer 10 latches the received data signal and drives the write amplifier 9 with this data signal. Then, a column address is externally input in the column decoder 44 through the column address buffer 8. Thus, the column decoder 4 selects the sense amplifier circuit part 46*a* corresponding to the input column address. The write amplifier 9 inputs the data signal latched by the input buffer 10 in the bit line BLT of the selected sense amplifier circuit part 46*a*. Thus, the potential of the bit line BLT of the selected sense amplifier circuit part 46*a* is set to a level corresponding to the data to be written in the ferroelectric memory cell 55. In order to write data "1" in the ferroelectric memory cell 55, for example, the potential of the bit line BLT is set to a level higher than the high-level potential of the ferroelectric memory selection word line WLF by at least the coercive voltage of the ferroelectric capacitor 56. In order to write data "0" in the ferroelectric memory cell 55, on the other hand, the potential of the bit line BLT is set to a level lower than the high-level potential of the ferroelectric memory selection word line WLF by at least the coercive voltage of the ferroelectric capacitor 56. The potential of the bit line BLT is transmitted to the ferroelectric memory selection bit line BLFT, whereby a voltage exceeding the coercive voltage is applied to the ferroelectric capacitor 56 from the ferroelectric memory selection word line WLF and the ferroelectric memory selection bit line BLFT. Thus, the data "1" or "0" is written in the ferroelectric capacitor 56. The data write operation on the ferroelectric memory cell array 2 is performed in the aforementioned manner.

In the write operation, data are destroyed in the ferroelectric capacitors 56 of the remaining ferroelectric memory cells 55 linked with the selected ferroelectric memory selection word line WLF but not subjected to the data write operation, and hence a data rewrite operation is performed after the write operation. This data rewrite operation following the write operation is performed similarly to the aforementioned rewrite operation following the read operation except that only the ferroelectric memory cells 55 linked with the selected ferroelectric memory selection word line WLF but not subjected to the data write operation are selected for this operation.

According to the second embodiment, as hereinabove described, the chip size can be effectively reduced not only by sharing the sense amplifier 6 between the SRAM cell array 1 and the ferroelectric memory cell array 2 but also by reducing the memory cell size in the case of constituting the ferroelectric memory cell array 2 of the ferroelectric memory cells 55 each having no transistor and consisting of one ferroelectric capacitor 56.

The remaining effects of the memory according to the second embodiment are similar to those of the memory according to the aforementioned first embodiment.

Third Embodiment

The structure of a memory according to a third embodiment of the present invention is now described with reference to FIGS. 1, 5 and 6.

In the memory according to the third embodiment, a ferroelectric memory cell array 2 has a hierarchical bit line structure, dissimilarly to the memories according to the aforementioned first and second embodiments. The term "hierarchical bit line structure" roughly denotes a structure shown in FIG. 6. In the hierarchical bit line structure, the ferroelectric memory cell array 2 is divided into a plurality of ferroelectric memory cell array blocks. A global bit line GBL is provided to be linked with the respective ones of the plurality of ferroelectric memory cell array blocks, while a local bit line BLB connected to the global bit line GBL through a selection transistor is provided every ferroelectric memory cell array block. Thus, the memory can select an arbitrary ferroelectric memory cell array block of the ferroelectric memory cell array 2 for performing data read and write operations on any ferroelectric memory cell in the selected ferroelectric memory cell array block through the corresponding local bit line LBL.

Figure 5:
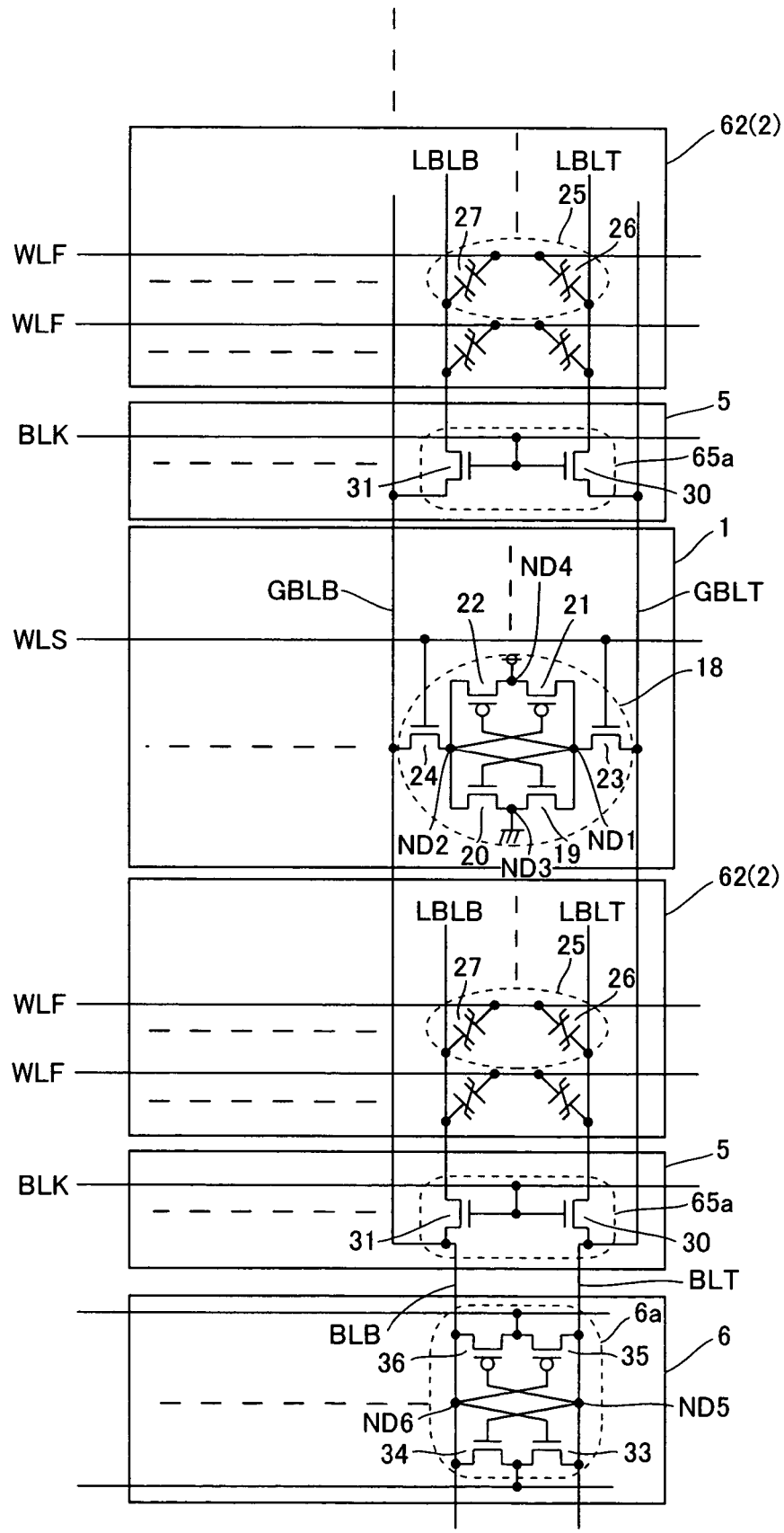
FIG. 5 is an equivalent circuit diagram for illustrating the structure of a memory according to a third embodiment of the present invention.
Figure 6:
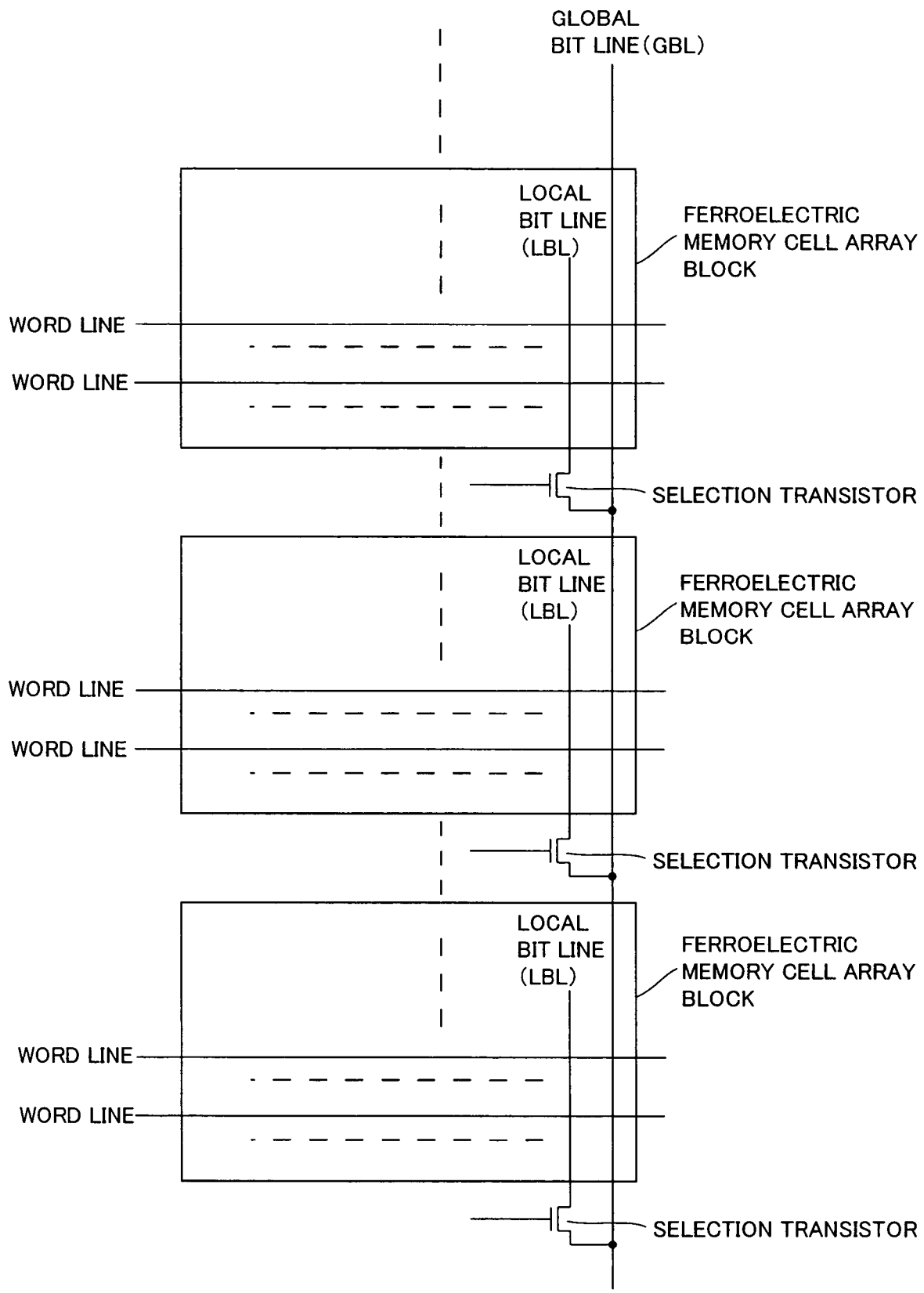
FIG. 6 is a schematic diagram for illustrating a hierarchical bit line structure of the memory according to the third embodiment shown in FIG. 5.

More specifically, the ferroelectric memory cell array 2 is divided into a plurality of ferroelectric memory cell array blocks 62 in the memory according to the third embodiment, as shown in FIG. 5. The ferroelectric memory cell array blocks 62 are examples of the "first memory cell array portions" in the present invention. A selection control circuit 5 is provided in correspondence to each ferroelectric memory cell array block 62. A plurality of sets of single ferroelectric memory cell array blocks 62 and single selection control circuits 5 are linked to global bit lines GBLT and GBLB. According to the third embodiment, the global bit lines GBLT and GBLB of the ferroelectric memory cell array 2 also function as bit lines of an SRAM cell array 1. The global bit lines GBLT and GBLB are examples of the "first bit line", the "second bit line" and the "first main bit line" in the present invention. A pair of local bit lines LBLT and LBLB are provided every ferroelectric memory cell array block 62. The local bit lines LBLT and LBLB are examples of the "first bit line" and the "first auxiliary bit line" in the present invention. The local bit lines LBLT and LBLB and the global bit lines GBLT and GBLB constitute the aforementioned hierarchical bit line structure (see FIG. 6).

According to the third embodiment, each selection control circuit part 65a is constituted of ferroelectric memory selection transistors 30 and 31. The ferroelectric memory selection transistors 30 and 31 are examples of the "third transistor" in the present invention. The ferroelectric memory selection transistors 30 and 31 perform control of connecting the local bit lines LBLT and LBLB to bit lines BLT and BLB of a sense amplifier 6 respectively. The bit lines BLT and BLB are examples of the "fourth bit line" in the present invention. The memory according to the third embodiment is provided with no SRAM selection transistors 28 and 29 (see FIG. 2), dissimilarly to the aforementioned first embodiment. The memory according to the third embodiment controls selection of any SRAM cell 18 through selection transistors 23 and 24 of the SRAM cell 18, in place of the SRAM selection transistors 28 and 29 (see FIG. 2) of the selection circuit part 5a in the first embodiment. The selection transistors 23 and 24 are examples of the "fourth transistor" and the "selection control transistor" in the present invention. A ferroelectric memory cell block selection signal BLK is input in the gates of the ferroelectric memory selection transistors 30 and 31.

The remaining structure of the memory according to the third embodiment is similar to that of the memory according to the aforementioned first embodiment.

Data read and write operations on the SRAM cell array 1 and the ferroelectric memory cell array 2 in the memory according to the third embodiment are now described with reference to FIG. 5.

(Common to Read and Write Operations on SRAM Cell Array)

In the read and write operations on the SRAM cell array 1 of the memory according to the third embodiment, a low-level ferroelectric memory cell block selection signal BLK is input in the gates of the ferroelectric memory selection transistors 30 and 31 of each selection control circuit part 65a in a standby state, thereby turning off all ferroelectric memory selection transistors 30 and 31. Thus, no potential change of the bit lines BLB and BLT of sense amplifier circuit parts 6a and the global bit lines GBLT and GBLB is transmitted to the local bit lines LBLT and LBLB in the read and write operations on the SRAM cell array 1, whereby ferroelectric capacitors 26 and 27 are inhibited from disturbance or destruction of data held therein. The remaining read and write operations on the SRAM cell array 1 according to the third embodiment are similar to the read and write operations on the SRAM cell array 1 according to the aforementioned first embodiment.

Read and write operations on the ferroelectric memory cell array 2 according to the third embodiment are now described.

(Common to Read and Write Operations on Ferroelectric Memory Cell Array)

In the read and write operations on the ferroelectric memory cell array 2 according to the third embodiment, a high-level ferroelectric memory cell block selection signal BLK is input in the gates of the ferroelectric memory selection transistors 30 and 31 of all selection control circuits 5 in a standby state, thereby turning on all ferroelectric memory selection transistors 30 and 31. A precharging/equalization circuit (not shown) provided in the sense amplifier 6 supplies a signal of a potential VSS (low level), thereby setting the potentials of the bit lines BLT and BLB to VSS (low level). Thus, the memory enters a standby state for performing the data read and write operations on the ferroelectric memory cell array 2.

In order to perform the read operation from this standby state, a row address is externally input in a row decoder 3 through a row address buffer 7 (see FIG. 1). Only the ferroelectric memory cell block selection signal BLK input in the selection control circuit 5 corresponding to the input row address is held at the high level while those input in the remaining selection control circuits 5 corresponding to other row addresses are dropped to low levels. Thus, only the ferroelectric memory selection transistors 30 and 31 of the selection control circuit 5 corresponding to the input row address are turned on so that only the ferroelectric memory cell array block 62 corresponding to the input row address can be selected and subjected to the read operation. The subsequent data read operation on the ferroelectric memory cell array block 62 is similar to the data read operation on the ferroelectric memory cell array 2 according to the aforementioned first embodiment.

In order to perform the write operation from the aforementioned standby state, only the ferroelectric memory cell array block 62 corresponding to a prescribed row address is selected and brought into a state allowing the write operation similarly to the aforementioned read operation. Thereafter the data write operation is performed on the ferroelectric memory cell array block 62 according to the third embodiment similarly to the data write operation on the ferroelectric memory cell array 2 according to the aforementioned first embodiment.

According to the third embodiment, as hereinabove described, the ferroelectric memory cell array 2 is constituted of the crosspoint memory cell array consisting of ferroelectric memory cells 25 having no transistors in the hierarchical bit line structure constituting of the global bit lines GBLT and GBLB and the local bit lines LBLT and LBLB, whereby the chip size can be effectively reduced not only by sharing the sense amplifier 6 between the SRAM cell array 1 and the ferroelectric memory cell array 2 but also by reducing the memory cell size.

According to the third embodiment, further, the selection control circuit 5 is employed for connecting the local bit lines LBLT and LBLB of the selected ferroelectric memory cell array block 62 to the global bit lines GBLT and GBLB respectively so that no circuit may be separately provided for selectively connecting the global bit lines GBLT and GBLB and the local bit lines LBLT and LBLB constituting the hierarchical bit line structure with each other, whereby the circuit structure can be simplified.

According to the third embodiment, in addition, the global bit lines GBLT and GBLB of the ferroelectric memory cell array 2 and the bit lines of the SRAM cell array 1 are so shared that the global bit lines GBLT and GBLB of the ferroelectric memory cell array 2 and the bit lines of the SRAM cell array 1 may not be individually provided despite the hierarchical bit line structure of the bit lines connected to the ferroelectric memory cells 25, whereby the number of wires can be reduced in the hierarchical bit line structure of the bit lines connected to the ferroelectric memory cells 25.

The remaining effects of the memory according to the third embodiment are similar to those according to the aforementioned first embodiment.

Fourth Embodiment

Figure 7:
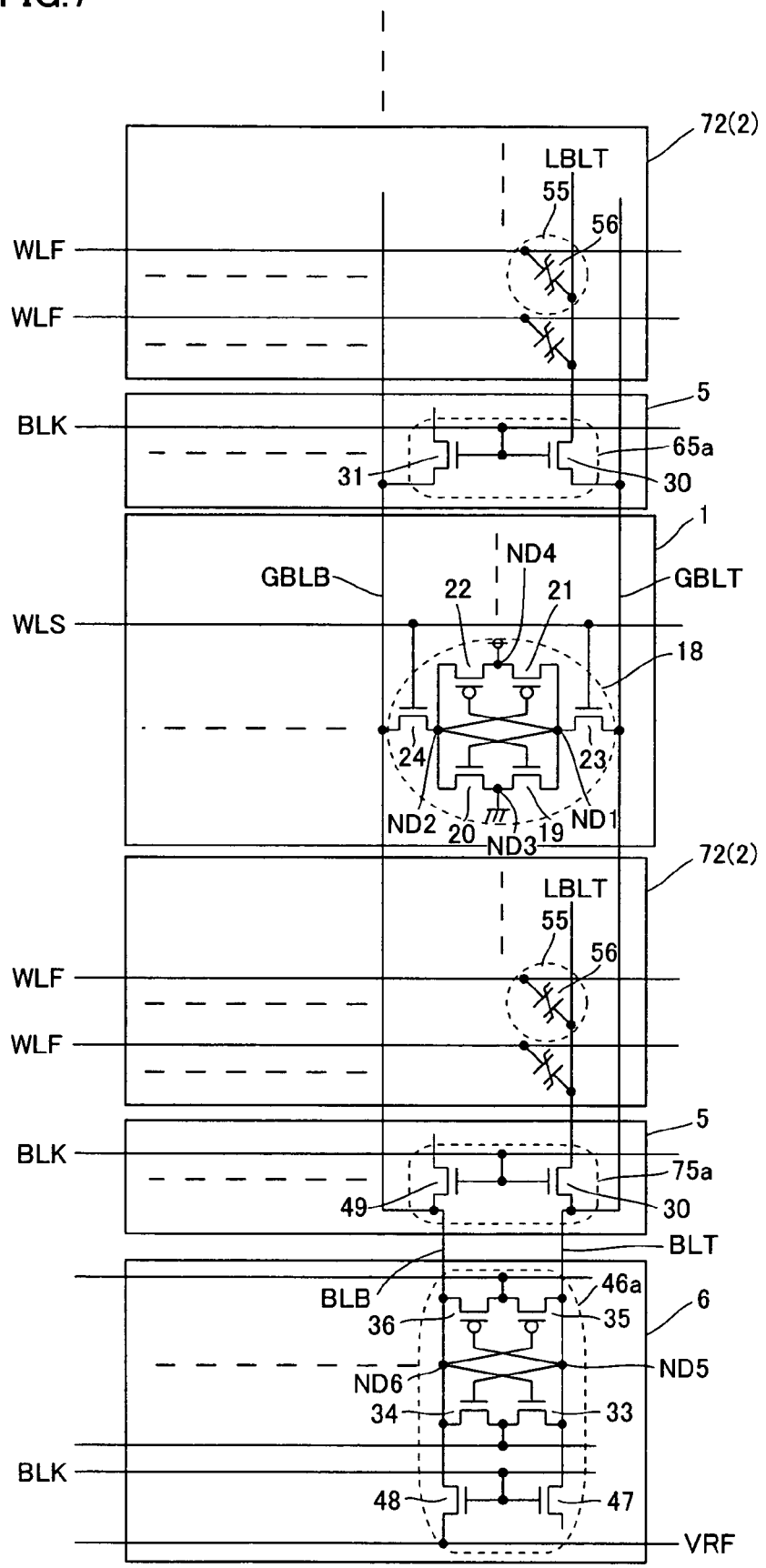
FIG. 7 is an equivalent circuit diagram for illustrating the structure of a memory according to a fourth embodiment of the present invention.

The structure of a memory according to a fourth embodiment of the present invention is now described with reference to FIG. 7.

According to the fourth embodiment, a ferroelectric memory cell array 2 is divided into a plurality of ferroelectric memory cell array blocks 72 and has a hierarchical bit line structure (see FIG. 6), similarly to the aforementioned third embodiment. According to the fourth embodiment, each ferroelectric memory cell 55 is constituted of one ferroelectric capacitor 56, dissimilarly to the aforementioned third embodiment. According to the fourth embodiment, further, a global bit line GBLT of the ferroelectric memory cell array 2 functions also as a bit line of an SRAM cell array 1. According to the fourth embodiment, in addition, local bit lines LBLT are provided in the ferroelectric memory cell array blocks 72 along with no local bit lines LBLB, dissimilarly to the aforementioned third embodiment. Each sense amplifier circuit part 46a is constituted similarly to the sense amplifier circuit part 46a (see FIG. 4) according to the aforementioned second embodiment. However, a ferroelectric memory cell block selection signal BLK is input in the gates of n-channel transistors 47 and 48 of the sense amplifier circuit part 46a. Each selection control circuit part 75a has a structure obtained by removing the SRAM selection transistors 28 and 29 and the inverter circuit 32 from the selection control circuit 5a (see FIG. 4) according to the aforementioned second embodiment. However, the ferroelectric memory cell block selection signal BLK is input in the gates of a ferroelectric memory selection transistor 30 and an n-channel transistor 49. The remaining structure of the memory according to the fourth embodiment is similar to that of the memory according to the aforementioned third embodiment.

Read and write operations on the SRAM cell array 1 and the ferroelectric memory cell array 2 in the memory according to the fourth embodiment are now described with reference to FIG. 7.

(Common to Read and Write Operations on SRAM Cell Array)

In the read and write operations on the SRAM cell array 1 of the memory according to the fourth embodiment, a low-level ferroelectric memory cell block selection signal BLK is input in the gates of the ferroelectric memory selection transistor 30 and another ferroelectric memory selection transistor 31 of each selection control circuit part 65a in a standby state, thereby turning off all ferroelectric memory selection transistors 30 and 31. Thus, no potential change of the bit lines BLB and BLT of the sense amplifier circuit parts 46a, the global bit line GBLT and another global bit line GBLB is transmitted to the local bit lines LBLT in the read and write operations on the SRAM cell array 1, whereby the ferroelectric capacitors 56 are inhibited from disturbance or destruction of data held therein. The remaining read and write operations on the SRAM cell array 1 according to the fourth embodiment are similar to the read and write operations on the SRAM cell array 1 according to the aforementioned first embodiment.

(Common to Read and Write Operations on Ferroelectric Memory Cell Array)

The read and write operations on the ferroelectric memory cell array 2 according to the fourth embodiment are similar to the read and write operations on the ferroelectric memory cell array 2 according to the aforementioned third embodiment from the standby state up to a state of selecting only the ferroelectric memory cell array block 72 corresponding to a prescribed row address for performing the write operation. Thereafter data are read and written from and in the ferroelectric memory cell array block 72 according to the fourth embodiment, similarly to the data read and write operations on the ferroelectric memory cell array 2 according to the aforementioned second embodiment.

According to the fourth embodiment, as hereinabove described, the ferroelectric memory cell array 2 is constituted of a crosspoint memory cell array consisting of the ferroelectric memory cells 55, each constituted of one ferroelectric capacitor 56, having no transistors in the hierarchical bit line structure consisting of the global bit line GBLT and the local bit lines LBLT, whereby the chip size can be effectively reduced not only by sharing a sense amplifier 6 between the SRAM cell array 1 and the ferroelectric memory cell array 2 but also by reducing the memory cell size.

The remaining effects of the fourth embodiment are similar to those of the aforementioned first to third embodiments.

Although the present invention has been described and illustrated in detail, it is clearly understood that the same is by way of illustration and example only and is not to be taken by way of limitation, the spirit and scope of the present invention being limited only by the terms of the appended claims.

For example, while the memory is constituted of SRAM cells and crosspoint ferroelectric memory cells in each of the aforementioned embodiments, the present invention is not restricted to this but the crosspoint ferroelectric memory cells may be replaced with crosspoint MRAM (magnetic random access memory) or RRAM (resistance random access memory) cells. Further, the SRAM cells may be replaced with DRAM cells or the like.

While the selection control circuits are constituted of n-type MOS transistors in each of the aforementioned embodiments, the present invention is not restricted to this but the n-type MOS transistors of the selection control circuits may be replaced with CMOS transfer gates formed by combining n-type MOS transistors and p-type MOS transistors with each other. Further, the selection control circuits may alternatively be constituted of p-type MOS transistors, in place of the n-type MOS transistors.

While the n-channel transistors 48 and 49 are provided in correspondence to the n-channel transistors 47 and 30 respectively in order to balance the capacities of the bit lines BLT and BLB in each of the aforementioned second and fourth embodiments, the present invention is not restricted to this but the n-channel transistors 48 and 49 may not be provided if potential difference is so developed between the bit lines BLT and BLB that influence exerted by the capacities of the n-channel transistors 47 and 30 can be neglected when the sense amplifier 6 compares and amplifies the potentials of the bit lines BLT and BLB.

While the bit lines of the SRAM cells and the global bit line of the ferroelectric memory cell array are shared in each of the third and fourth embodiments, the present invention is not restricted to this but the bit lines of the SRAM cells and the global big line of the ferroelectric memory cell array may be provided independently of each other.

What is claimed is:

1. A memory comprising:
   a first memory cell array having a plurality of first memory cells;
   a second memory cell array having a plurality of second memory cells different in type from said first memory cells;
   a selection control circuit provided separately from said first memory cell array and said second memory cell array for controlling selection of either said first memory cell array or said second memory cell array, wherein the selection control circuit selects all of only one memory cell array at a time and simultaneously prevents access to the non-selected memory cell array;
   a first bit line connected to said first memory cells of said first memory cell array, and
   a second bit line connected to said second memory cells of said second memory cell array, wherein
   the first bit line and the second bit line are arranged in a same column, and said selection control circuit directly controls selection of at least said first bit line between said first bit line and said second bit line in response to a single activation selection signal.

2. The memory according to claim 1, wherein said first memory cells of said first memory cell array have no transistors while having storage means arranged on the intersections between bit lines and word lines.

3. The memory according to claim 2, wherein each said storage means is constituted of two ferroelectric capacitors holding data inverse to each other.

4. The memory according to claim 2, wherein each said storage means is constituted of only one ferroelectric capacitor holding data.

5. The memory according to claim 2, wherein said second memory cell array is formed under said first memory cell array in a multilayered manner.

6. The memory according to claim 5, wherein said second memory cells of said second memory cell array have transistors.

7. The memory according to claim 1, wherein each said second memory cell of said second memory cell array includes an SRAM cell.

8. A memory comprising:
   a first memory cell array having a plurality of first memory cells;
   a second memory cell array having a plurality of second memory cells different in type from said first memory cells; and
   a selection control circuit provided separately from said first memory cell array and said second memory cell array for controlling selection of either said first memory cell array or said second memory cell array, further comprising:
   a first bit line connected to said first memory cells of said first memory cell array, and
   a second bit line connected to said second memory cells of said second memory cell array, wherein
   said selection control circuit controls selection of at least said first bit line between said first bit line and said second bit line, further comprising a read/write circuit for performing at least either data reading or data writing on said first memory cell array and said second memory cell array, wherein
   said read/write circuit includes a third bit line, and
   said selection control circuit performs control of connecting at least said first bit line between said first bit line and said second bit line to said third bit line of said read/write circuit.

9. The memory according to claim 8, wherein said selection control circuit includes at least a first transistor connected between said first bit line and said third bit line for performing control of connecting said first bit line to said third bit line.

10. The memory according to claim 9, wherein said selection control circuit further includes a second transistor connected between said second bit line and said third bit line for performing control of connecting said second bit line to said third bit line.

11. The memory according to claim 10, wherein one of said first transistor and said second transistor enters an OFF state when the other one of said first transistor and said second transistor is in an ON state.

12. The memory according to claim 11, wherein said first transistor and said second transistor are of the same conductive type,
   said selection control circuit includes an inverter circuit connected to the gate of said first transistor,
   the gate of said second transistor receives a control signal for controlling the ON/OFF state of said second transistor, and
   the gate of said first transistor receives an inverted signal of said control signal through said inverter circuit.

13. A memory comprising:
   a first memory cell array having a plurality of first memory cells;
   a second memory cell array having a plurality of second memory cells different in type from said first memory cells; and
   a selection control circuit provided separately from said first memory cell array and said second memory cell array for controlling selection of either said first memory cell array or said second memory cell array, further comprising:
   a first bit line connected to said first memory cells of said first memory cell array, and
   a second bit line connected to said second memory cells of said second memory cell array, wherein
   said selection control circuit controls selection of at least said first bit line between said first bit line and said second bit line, wherein
   said first memory cell array includes a plurality of first memory cell array portions,
   said first bit line includes a first auxiliary bit line provided every said first memory cell array portion and a first main bit line connected with selected said first auxiliary bit line, and said selection control circuit also has a function of connecting said first auxiliary bit line of selected said first memory cell array portion to said first main bit line.

14. The memory according to claim 13, further comprising a read/write circuit for either reading or writing data from or in said first memory cell array and said second memory cell array, wherein said read/write circuit includes a fourth bit line, and said first main bit line is connected to said fourth bit line.

15. The memory according to claim 13, wherein said selection control circuit includes a third transistor connected between said first auxiliary bit line and said first main bit line for performing control of connecting said first auxiliary bit line of said selected first memory cell array portion to said first main bit line.

16. The memory according to claim 15, wherein each said second memory cell of said second memory cell array includes a fourth transistor performing control of connecting said second memory cell to said second bit line.

17. The memory according to claim 16, wherein each said second memory cell is an SRAM cell, and said fourth transistor is a selection control transistor included in said SRAM cell.

18. The memory according to claim 16, wherein one of said third transistor and said fourth transistor enters an OFF state when the other one of said third transistor and said fourth transistor is in an ON state.

19. The memory according to claim 13, wherein said first main bit line and said second bit line are shared.

* * * * *

UNITED STATES PATENT AND TRADEMARK OFFICE
CERTIFICATE OF CORRECTION

PATENT NO.       : 7,319,606 B2                                          Page 1 of 1
APPLICATION NO.  : 11/090660
DATED            : January 15, 2008
INVENTOR(S)      : Hideaki Miyamoto It is certified that error appears in the above-identified patent and that said Letters Patent is hereby corrected as shown below:

Title Page, item 56, under "FOREIGN PATENT DOCUMENTS" section,
"WO   2002-026283   A   1/2002"
should read --JP   2002-026283   A   1/2002--

Signed and Sealed this

Sixth Day of July, 2010

David J. Kappos
*Director of the United States Patent and Trademark Office*